(12) United States Patent
Tsang (10) Patent No.: US 6,864,551 B2
(45) Date of Patent: Mar. 8, 2005

(54) HIGH DENSITY AND HIGH PROGRAMMING EFFICIENCY MRAM DESIGN

(75) Inventor: David Tsang, Cupertino, CA (US)

(73) Assignee: Applied Spintronics Technology, Inc., Milpitas, CA (US)

(*) Notice: Subject to any disclaimer, the term of this patent is extended or adjusted under 35 U.S.C. 154(b) by 0 days.

(21) Appl. No.: 10/606,612

(22) Filed: Jun. 26, 2003

(65) Prior Publication Data

US 2004/0150015 A1 Aug. 5, 2004

Related U.S. Application Data

(60) Provisional application No. 60/444,881, filed on Feb. 5, 2003.

(51) Int. Cl.[7] .......................... H01L 29/82; H01L 43/00
(52) U.S. Cl. ................ 257/421; 257/295; 257/E27.006
(58) Field of Search ................... 257/421, 295, 257/E27.006

(56) References Cited

U.S. PATENT DOCUMENTS

| | | | |
|---|---|---|---|
| 5,659,499 A | | 8/1997 | Chen et al. |
| 5,940,319 A | | 8/1999 | Durlam et al. |
| 5,956,267 A | * | 9/1999 | Hurst et al. .................. 365/158 |
| 6,153,443 A | | 11/2000 | Durlam et al. |
| 6,211,090 B1 | | 4/2001 | Durlam et al. |
| 6,335,890 B1 | | 1/2002 | Reohr et al. |
| 2002/0034117 A1 | | 3/2002 | Okazawa |
| 2002/0080643 A1 | | 6/2002 | Ito |
| 2002/0127743 A1 | | 9/2002 | Nickel et al. |
| 2004/0075125 A1 | * | 4/2004 | Asao ........................... 257/295 |

* cited by examiner

*Primary Examiner*—David Nelms
*Assistant Examiner*—Tu-Tu Ho
(74) *Attorney, Agent, or Firm*—Sawyer Law Group LLP (57) ABSTRACT

A method and system for providing a magnetic memory is disclosed. The magnetic memory includes a magnetic element. The magnetic element is written using a first write line and a second write line and resides at an intersection between the first and second write lines. The second write line is oriented at an angle to the first write line. The second write line has a top and at least one side. At least a portion of the second write line is covered by an insulating layer. A magnetic layer covers a portion of the insulating layer. The portion of the insulating layer resides between the magnetic layer and the second write line. The magnetic layer includes a soft magnetic material.

19 Claims, 5 Drawing Sheets

Fig. 6

HIGH DENSITY AND HIGH PROGRAMMING EFFICIENCY MRAM DESIGN

CROSS-REFERENCE TO RELATED APPLICATIONS

This application is claiming under 35 USC 119(e) the benefit of provisional patent application Ser. No. 60/444,881 filed on Feb. 5, 2003.

The present application is related to co-pending U.S. patent application Ser. No. 60/431,742 entitled "MRAM MEMORIES UTILIZING MAGNETIC WRITE LINES", filed on Dec. 9, 2002, and assigned to the assignee of the present application.

FIELD OF THE INVENTION

The present invention pertains to magnetic memories, and more particularly to a method and system for providing write lines for nonvolatile magnetic random access memory (MRAM) that may reduce the cell size, simplify fabrication processes, improve reliability, and improve programming efficiency.

BACKGROUND OF THE INVENTION

Figure 1:
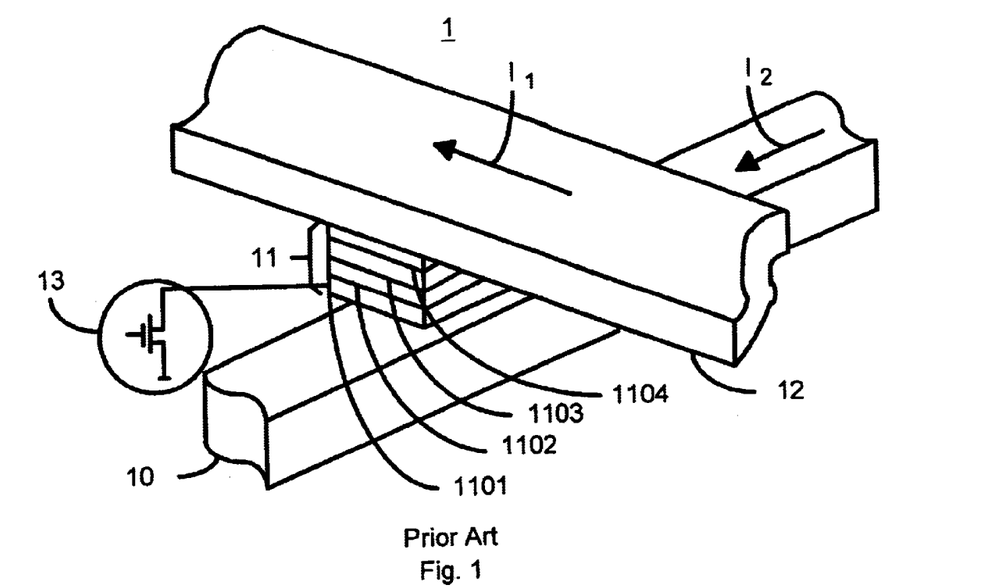
FIG. 1 is a three-dimensional view of a portion of a conventional magnetic memory including a MTJ cell, located at the intersection of a bit line and a word line.

Recently, a renewed interest in thin-film magnetic random access memories (MRAM) has been sparked by the potential application of MRAM to both nonvolatile and volatile memories. FIG. 1 depicts a portion of a conventional MRAM 1. The conventional MRAM includes conventional orthogonal conductor lines 10 and 12, conventional magnetic storage cell 11 and conventional transistor 13. The conventional MRAM 1 utilizes a conventional magnetic tunneling junction (MTJ) stack 11 as a memory cell. Use of a conventional MTJ stack 11 makes it possible to design an MRAM cell with high integration density, high speed, low read power, and soft error rate (SER) immunity. The conductive lines 10 and 12 are used for writing data into the magnetic storage device 11. The MTJ stack 11 is located on the intersection of and between 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 11 stack primarily includes the free layer 1104 with the changeable magnetic vector (not explicitly shown), the pinned layer 1102 with the fixed magnetic vector (not explicitly shown), and the insulator 1103 in between the two magnetic layers 1104 and 1102. The insulator 1103 typically has a thickness that is low enough to allow tunneling of charge carriers between the magnetic layers 1102 and 1104. Layer 1101 is usually a composite of seed layers and an anti-ferromagnetic layer that is strongly coupled to the pinned magnetic layer.

Data is stored in the conventional MTJ stack 11 by applying a magnetic field to the conventional MTJ stack 11. The applied magnetic field has a direction chosen to move the changeable magnetic vector of the free layer 1104 to a selected orientation. During writing, the electrical current $I_1$ flowing in the conventional bit line 12 and $I_2$ flowing in the conventional word line 10 yield two magnetic fields on the free layer 1104. In response to the magnetic fields generated by the currents $I_1$ and $I_2$, the magnetic vector in free layer 1104 is oriented in a particular, stable direction. This direction depends on the direction and amplitude of $I_1$ and $I_2$ and the properties and shape of the free layer 1104. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Stored data is read or sensed by passing a current through the conventional MTJ cell from one magnetic layer to the other. During reading, the conventional transistor 13 is turned on and a small tunneling current flows through the conventional MTJ cell. The amount of the current flowing through the conventional MTJ cell 11 or the voltage drop across the conventional MTJ cell 11 is measured to determine the state of the memory cell. In some designs, the conventional transistor 13 is replaced by a diode, or completely omitted, with the conventional MTJ cell 11 in direct contact with the conventional word line 10.

Although the above conventional MTJ cell 11 can be written using the conventional word line 10 and conventional bit line 12, one of ordinary skill in the art will readily recognize that the amplitude of $I_1$ or $I_2$ is in the order of several milli-Amperes for most designs. Therefore, one of ordinary skill in the art will also recognize that a smaller writing current is desired for many memory applications.

Figure 2:
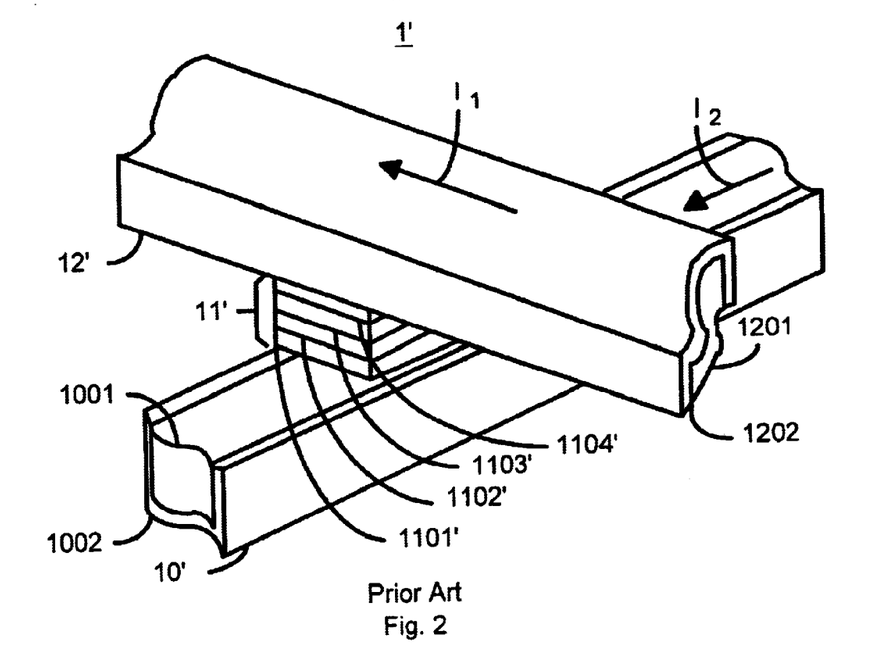
FIG. 2 is a three-dimensional view of a portion of a conventional magnetic memory including a MTJ cell, located at the intersection of a bit line and a word line, where the bit line and the word line have magnetic cladding to improve write efficiency.

FIG. 2 depicts a portion of a conventional magnetic memory 1' that has a lower writing current. Similar systems are described in U.S. Pat. No. 5,659,499, U.S. Pat. No. 5,940,319, U.S. Pat. No. 6,211,090, U.S. Pat. No. 6,153,443, and U.S. Patent Application Publication No. 2002/0127743. The conventional systems and conventional methods for fabricating the conventional systems disclosed in these references encapsulate bit lines and word lines with soft magnetic cladding layer on the three surfaces not facing MTJ cell 11'. Many of the portions of the conventional memory depicted in FIG. 2 are analogous to those depicted in FIG. 1 and are thus labeled similarly. The system depicted in FIG. 2 includes the conventional MTJ cell 11', conventional word line 10' and bit line 12'. The conventional word line 10' is composed of two parts: a copper core 1001 and a soft magnetic cladding layer 1002. Similarly, the conventional bit line 12' is composed of two parts: a copper core 1201 and a soft magnetic cladding layer 1202.

Relative to the design in FIG. 1, the soft magnetic cladding layers 1002 and 1202 can concentrate the magnetic flux associated with $I_1$ and $I_2$ onto the MTJ cell 11' and reduce the magnetic field on the surfaces which are not facing the MTJ cell 11'. Thus, the sot magnetic cladding layers 1002 and 1202 concentrate the flux on the MTJ that makes up the MTJ cell 11', making the free layer 1104 easier to program.

Although this approach works well theoretically, one of ordinary skill in the art will readily recognize that the magnetic properties of the portions of the soft cladding layers 1002 and 1202 on the vertical sidewalls of the conventional lines 10' and 12', respectively, are hard to control. One of ordinary skill in the art will also recognize that the process of making the conventional word line 10' and the conventional bit line 12' is complicated. Formation of the conventional word line 10' and conventional bit line 12' including the cladding layers 1002 and 12002, respectively, requires approximately nine thin film deposition steps, five photolithography steps, six etching steps, and one chemical mechanical polishing (CMP) step. Furthermore, none of the processes can be shared with other CMOS processes. Some of the processes, such as the CMP process and a few thin-film deposition and etching processes, need to be tightly controlled in order to achieve the designed performance. Because the wafer surface on which the devices are fabricated is not flat and the portion to be removed is deep in the trenches, the write lines 10' and 12' need to be laid out fairly sparsely to accommodate the photolithography process. As a consequence, the density and capacity of memory devices on a chip will be sacrificed if soft magnetic cladding layer 1202 and 1002 is used for the lines 10' and 12'. This complicated fabrication methods pose significant challenge to scaling to higher densities. Accordingly it is highly desirable to provide an MRAM architecture which is scalable, easy to fabricate, and offers high writing efficiency.

Other aspects of the conventional write lines 10, 10', 12, and 12' of the conventional designs depicted in both FIG. 1 and FIG. 2 limit scalability. In these conventional designs, the conventional write lines 10, 10', 12, and 12' are mostly made of either aluminum or copper. The current density limits for aluminum and copper are in the order of $1 \times 10^6$ A/cm$^2$ or less. As the line width decreases to increase the memory density, the electromigration current density limit poses severe challenges for scaling.

Other conventional systems attempt to propose different solutions, each of which has its drawbacks. As an example, U.S. Patent Application Publication No. 2002/0080643 proposed that, after a write operation, a reverse current is applied to the write lines to prevent electromigration. But such conventional methods compromise performance by reducing the speed of the memory and add complexities. Thus, it is also highly desirable to have write line made of materials with high reliability in electromigration, which will allows for easy scalability to high density memory arrays.

Conventional thin bit lines, which might be used for smaller or more efficient memories have shortcomings. Thinner conventional bit lines have higher resistances. This adversely affects the performance of the overall memory array. However, there are many conventional methods of overcoming this issue. One common practice is to break up the long bit lines in the memory array into global bit lines that are made of thick metals, and connect the global bit lines into local bit lines that are made of thinner metals, and thus have a higher resistance. Examples of such design are taught by U.S. Pat. No. 6,335,890 and U.S. Patent Application Publication No. 2002/0034117. However, the other problems described above, such as the electromigration are still not overcome.

Accordingly, what is needed is a system and method for providing a scalable, efficient, low current magnetic memory that improves ease of manufacturing and reliability against electromigration. The present invention addresses such a need.

SUMMARY OF THE INVENTION

The present invention provides method and system for providing a magnetic memory. The magnetic memory comprises a magnetic element. The magnetic element is written using a first write line and a second write line and resides at an intersection between the first and second write lines. The second write line is oriented at an angle to the first write line. A portion of the second write line is covered by an insulating layer. A magnetic layer covers a portion of the insulating layer. The insulating layer resides between the magnetic layer and the second write line. The magnetic layer includes a soft magnetic material.

According to the system and method disclosed herein, the present invention provides a magnetic memory that may be scaled to higher densities, written at relatively low currents, have improved reliability against electromigration, and be simpler to fabricate.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 3:
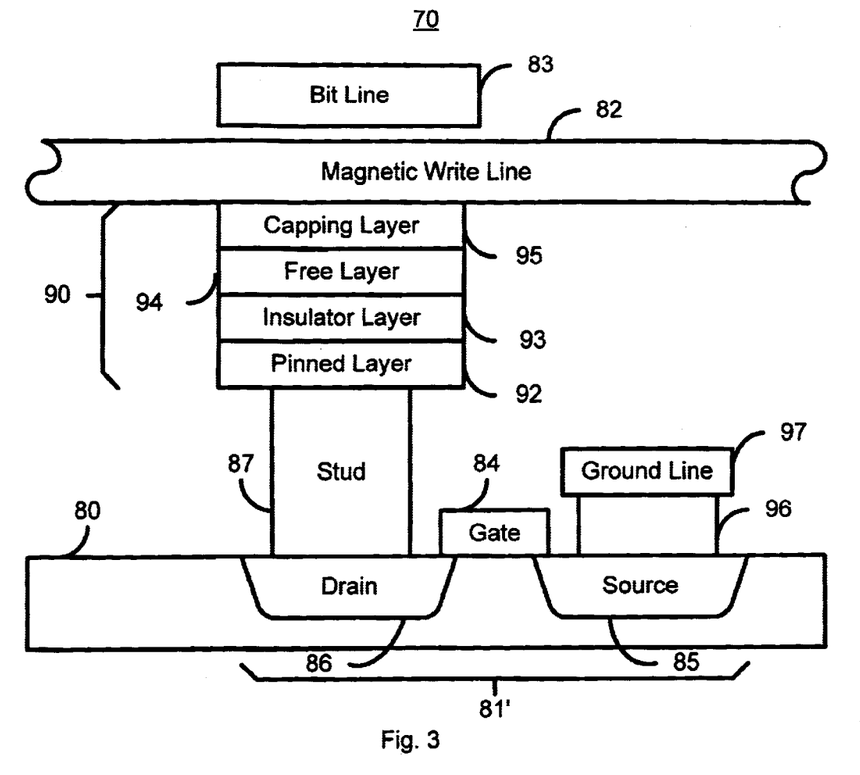
FIG. 3 depicts a cross-sectional view of an architecture including a MTJ MRAM cell.

Co-pending U.S. patent application Ser. No. 60/431,742 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application. FIG. 3 depicts one embodiment of a portion of an MRAM 70 including the basic structure described in the above-identified co-pending application. The MRAM 70 depicted in FIG. 3 includes a magnetic element 90, which is preferably a MTJ stack 90, a selection device 81 formed in a substrate 80, a magnetic write line 82, a bit line 83, a conductive stud 87, connecting stud 96 and ground line 97. The selection device 81 is preferably a FET transistor including gate 84, source 85 and drain 86. The MTJ stack also includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack includes layers (not explicitly shown) that includes seed and, preferably, antiferromagnetic layers.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to a cladding layer, includes the soft magnetic layer. Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, write efficiency is improved.

Although the MRAM architecture described in the above-identified co-pending application functions well for its intended purpose, one of ordinary skill in the art will readily recognize that a relatively large current through the bit line 83 is still used. In addition, fabrication may also be relatively complex.

Accordingly it is highly desirable to provide an MRAM architecture which can be fabricated with a simplified wafer process while still offers high writing efficiency, scalability, small cell size and a lower write current.

The present invention provides method and system for providing a magnetic memory. The magnetic memory comprises a magnetic element. The magnetic element is written using a first write line and a second write line and resides at an intersection between the first and second write lines. The second write line is oriented at an angle to the first write line. At least a portion of the second write line is covered by an insulating layer. A magnetic layer covers a portion of the insulating layer. The insulating layer resides between the magnetic layer and the portion of the second write line. The magnetic layer is preferably a soft magnetic material.

The present invention will be described in terms of particular types of magnetic memory cells, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices, particularly those in which a reduction in process complexity, a decrease cell size and an improvement write efficiency is desired. For example, although MTJ stacks are described as including single magnetic layers, nothing prevents the use of other materials, other alloys and synthetic layers. In addition, although the present invention is described in the context of metal-oxide-semiconductor (MOS) devices and magnetic tunneling junction (MTJ) devices, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. One of ordinary skill in the art will also readily recognize that although the present invention is described using the terms "word line" and "bit line" are used to refer to particular lines of particular location and orientation for clarity. However, one of ordinary skill in the art will readily recognize that these terms are for reference purposes only, and can be exchanged or substituted with other names for the write lines.

Figure 4:
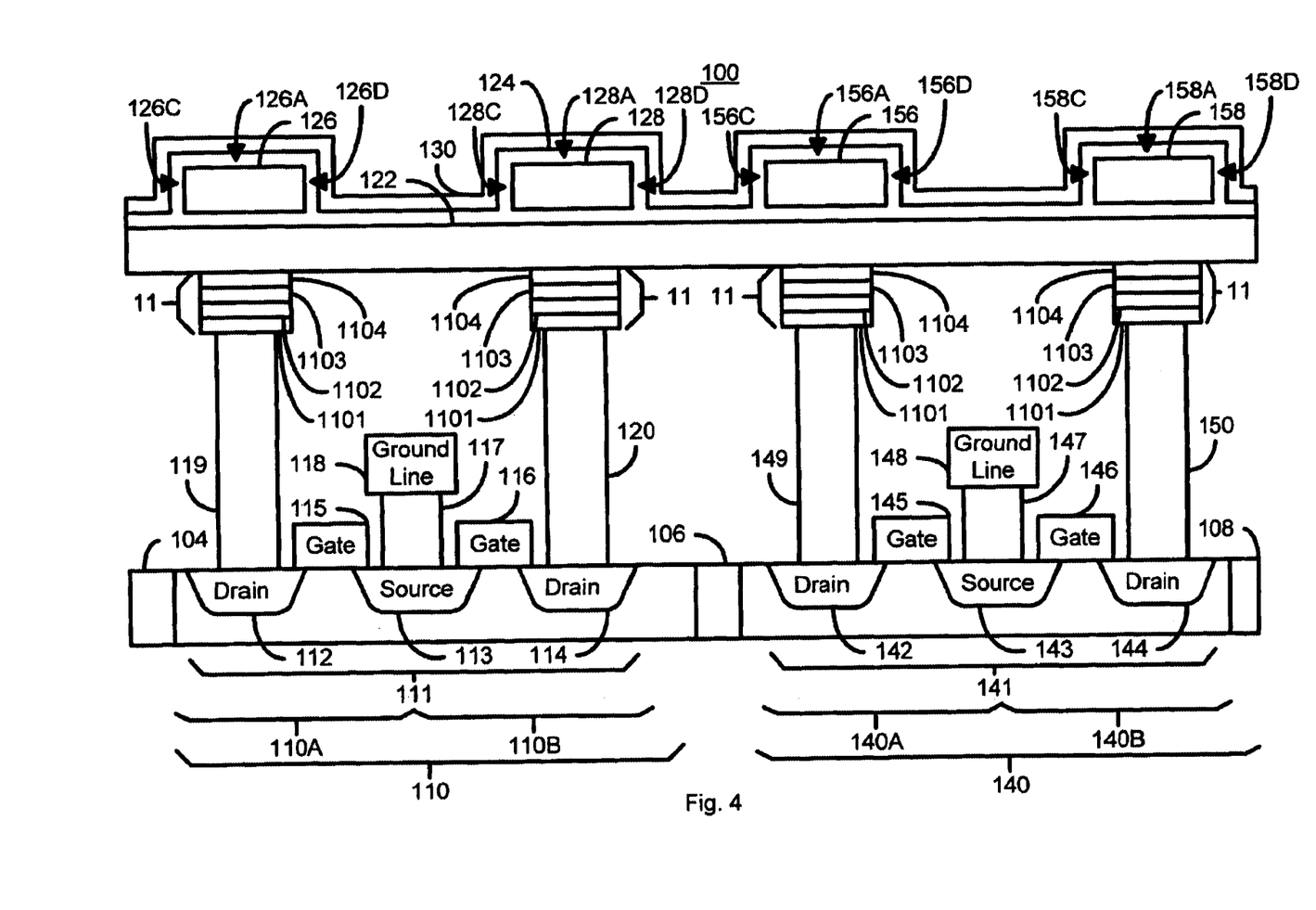
FIG. 4 depicts one embodiment of a portion of an MRAM in accordance with the present invention.

To more particularly illustrate the method and system in accordance with the present invention, refer now to FIG. 4, depicting one embodiment of a portion of an MRAM 100 in accordance with the present invention. Preferably, the MRAM 100 is based upon the cell 70 depicted in FIG. 3. Referring back to FIG. 4, the MRAM 100 includes four cells 110A, 110B, 140A, and 140B. The MRAM cells 110A, 110B, 140A and 140B utilize conventional MTJ stacks 11 as a magnetic element. Thus, the MTJ stacks 11 include layers 1101, pinned layer 1102, insulator 1103, and free layer 1104 that are described above. As discussed above, the layers 1101 generally include seed layers and an AFM layer (not explicitly shown). The two MRAM cells 110A and 110B together form structure 110. Similarly, the two MRAM cells 140A and 140B together form structure 140. The structure 140 is analogous to the structure 110 and will, therefore, not be discussed in detail. Instead, the structure 110 is described. The structures 110 and 140 are insulated by dielectric plugs 104, 106, and 108.

The structure 110 utilizes selection device 111. The selection device includes drains 112 and 114, source 113 and gates 115 and 116. The source 113 is connected to a ground line 118 via a metal plug 117. Metal plugs 119 and 120 connect the drains 112 and 114, respectively, to the magnetic elements 11.

The MRAM 100 also includes a word line 122 and write bit lines 126 and 128. The word line 122 is preferably a magnetic word line. Thus, the magnetic word line 122 is preferably made substantially of a soft magnetic material, such as Co, Fe, Ni, or alloy thereof. In addition, the magnetic word line 122 may be a limited structure that alternates magnetic and nonmagnetic layers. The write bit lines 126 and 128 are conductive. In addition, in different embodiments, the write bit lines 126 and 128 may be magnetic or nonmagnetic. The write bit lines 126 and 128 are insulated from the magnetic word line 122. The insulating layer 124 covers the write bit lines 126, 128, 156, and 158. Thus, the write bit line 126 has insulation on its top 126A and sides 126C and 126D. Similarly, the write bit line 128 has insulation on its top 128A and sides 128C and 128D. The insulating layer 124 insulates the write bit lines 126 and 128 from a soft magnetic layer 130. The insulating layer 124 is also depicted as insulating the write bit lines 126 and 128 from the word line 122. However, one of ordinary skill in the art will readily recognize that the lower portion of the insulator 124 that insulates the write bit lines 126 and 128 from the word line 122 is formed separately from, and could be a different material from the top portion of the insulator 124 that insulates the write bit lines 126 and 128 from the magnetic layer 130. The insulating layer 124 is preferably made of one or more dielectric materials. In a preferred embodiment, the insulating layer 124 is made of dielectric materials such as aluminum oxide, silicon oxide, or other oxides. The magnetic layer 130 is made of soft magnetic materials such as nickel, cobalt, iron, or alloys thereof.

In operation, a write current in bit line 126 or 128 generates a magnetic field around the lines 126 and 128, respectively. The portion of the soft magnetic layer 130 on the surfaces 126A, 126B, and 126C of bit line 126 short-circuits the three surfaces of 126A, 126B, and 126C of bit line 126 magnetically. Similarly, the portion of the soft magnetic layer 130 on the surface 128A, 128B, and 128C of the bit line 128 short circuits the three surface 128A, 128B, and 128C of the bit line 128 magnetically. As a result, the magnetic flux is concentrated into the space underneath bit lines 126 and 128 and onto free layer 1104 of the MTJ stack 11. In other words, the portion of the soft magnetic layer 130 on the surfaces 126A, 126B, 126C, 128A, 128B, and 128C increases the magnetic field in the space underneath write bit lines 126 and 128 and in proximity to the free layer 1104 by reducing the magnetic field around other portions of the lines 126 and 128. Consequently, the write efficiency of write line 83 is improved.

The structure 140 functions in an analogous manner to the structure 110. Consequently, structures are labeled similarly. Thus, the structure 140 includes selection device 141 that includes drains 142 and 144, source 143 and gates 155 and 156. The source 143 is connected to a ground line 148 via a metal plug 147. Metal plugs 149 and 150 connect the drains 142 and 144, respectively, to the magnetic elements 11. The structure 140 also uses the word line 122 and write bit lines 156 and 158. The write bit lines 156 and 158 are conductive. The write bit lines 156 and 158 may be magnetic. The write bit lines 156 and 158 are insulated from the magnetic word line 122. The insulating layer 124 covers the write bit lines 156 and 158. Thus, the write bit line 156 has insulation on its top 156A and sides 156C and 156D. Similarly, the write bit line 158 has insulation on its top 158A and sides 158C and 158D. The insulating layer 124 insulates the write bit lines 156 and 158 from a soft magnetic layer 130. The insulating layer 124 is also depicted as insulating the write bit lines 156 and 158 from the word line 122. The bit lines 156 and 158 operate in the same fashion as the write bit lines 126 and 128, respectively. Consequently, the write efficiency of write lines 126, 128, 156, and 158.

The soft magnetic layer 130 is electrically insulated from the bit lines 126, 128, 156, and 158 by the insulating layer 124. A single soft magnetic layer 130 can be utilized for all of the bit lines 126, 128, 156, and 158 without electrically shorting to the bit lines 126, 128, 156, and 158. As a result, the soft magnetic layer 130 need not be patterned in order to insulate the bit lines 126, 128, 156, and 158 from each other. Consequently, the MRAM 100 is much simpler to fabricate. As discussed above, to pattern the soft magnetic cladding layer 1002 and 1202 depicted in FIG. 2, photolithography and etching processes are used. At least some of these processes need not be used for the MRAM 100, thereby simplifying fabrication. Moreover, because fabrication is simplified and material in trenches need not be removed to from the soft magnetic layer 130, the write lines 126, 128, 156, and 158 need not be laid out fairly sparsely to accommodate photolithography processes. As a consequence, the density and capacity of memory devices on a chip will be improved.

Figure 5A:
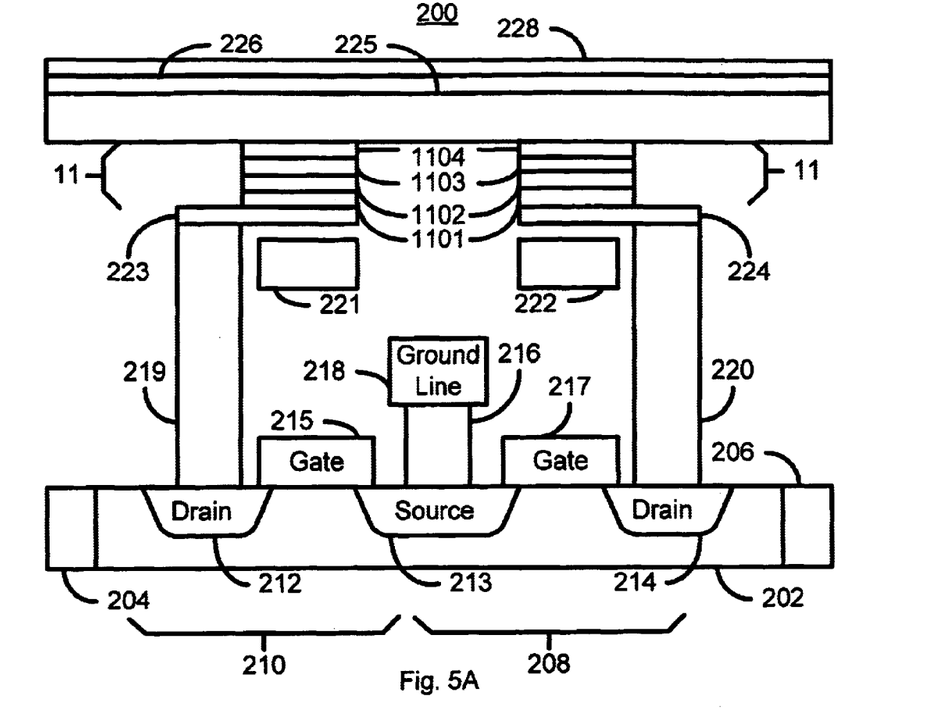
FIG. 5A depicts a second embodiment of a portion of an MRAM in accordance with the present invention.
Figure 5B:
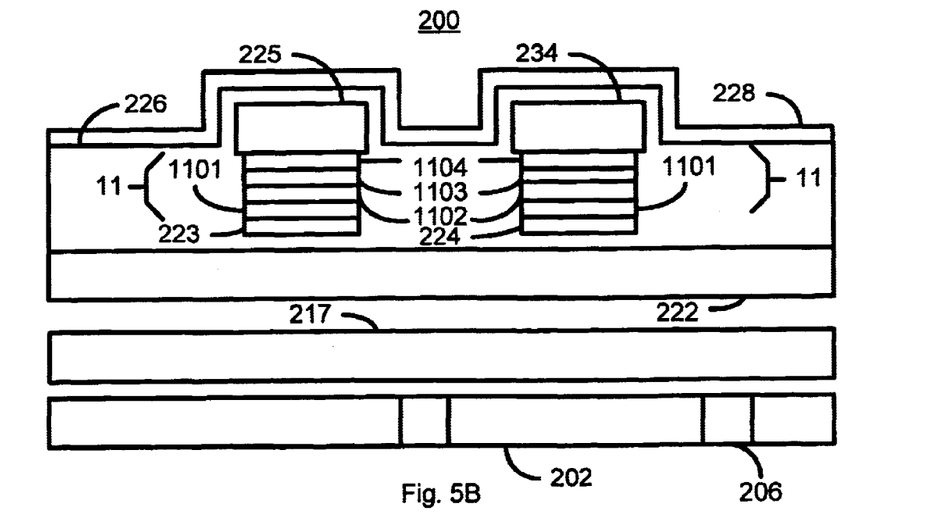
FIG. 5B depicts a cross-sectional view of the second embodiment of a portion of an MRAM in accordance with the present invention.

FIG. 5A depicts a second embodiment of a portion of an MRAM 200 in accordance with the present invention. FIG. 5B depicts a cross-sectional view of the second embodiment of a portion of the MRAM 200 in accordance with the present invention. Referring to FIGS. 5A and 5B, the MRAM 200 includes selection devices 208 and 210, which are preferably CMOS transistors. The structure 210 is isolated from like structures using dielectric trenches 204 and 206 in the substrate 202. The structure 200 includes two memory cells using two MTJ stacks 11. The CMOS transistor 210 includes a source 213, drains 212, and a gate 215. The CMOS transistor 208 includes the source 213, drain 214, and gate 217. A metal plug 216 connects the source 213 to ground conductor 218. Metal plugs 219 and 220 connect the drains 212 and 214, respectively, to the bottom electrodes 223 and 224 for the MTJ stacks 11. The write bit lines 221 and 222 reside below the MTJ stacks 11. The write word line 225 is oriented at an angle to the bit lines 221 and 222. The MRAM 200 also includes insulating layer 226 and soft magnetic layer 228. The insulating layer 226 and soft magnetic layer 228 correspond to the layers 124 and 130, respectively, depicted in FIG. 4. Referring back to FIGS. 5A and 5B the insulating layer 226 and soft magnetic layer 228 function in a similar manner to the insulating layer 124 and soft magnetic layer 130. In particular, the insulating layer 226 resides on the sides and tops of write word lines 225 and 234. The soft magnetic layer 228 is insulated from the write word lines 225 and 234 using the insulating layer 226. The soft magnetic layer 228 concentrates the magnetic flux below the lines 225, and 234. In other words, the portion of the soft magnetic layer 228 on the surfaces of lines 225, and 234 increases the magnetic field in the space underneath write bit lines 225 and 234 and in proximity to the free layer 1103 by reducing the magnetic field around other portions of the lines 225 and 234. Consequently, the write efficiency of write line 225 is improved.

Furthermore, the soft magnetic layer 228 is insulated from the word lines 225, and 234 using the insulating layer 226. Consequently, a single soft magnetic layer 228 can be utilized for all of the word lines 225, and 234 without electrically shorting the word lines 225 and 234. As a result, the soft magnetic layer 228 need not be patterned to insulate the word lines from each other. The MRAM 200 is, therefore, much simpler to fabricate. Moreover, because fabrication is simplified, the word lines 225, and 234 need not be laid out fairly sparsely to accommodate photolithography processes. As a consequence, the density and capacity of memory devices on a chip will be improved.

Figure 6:
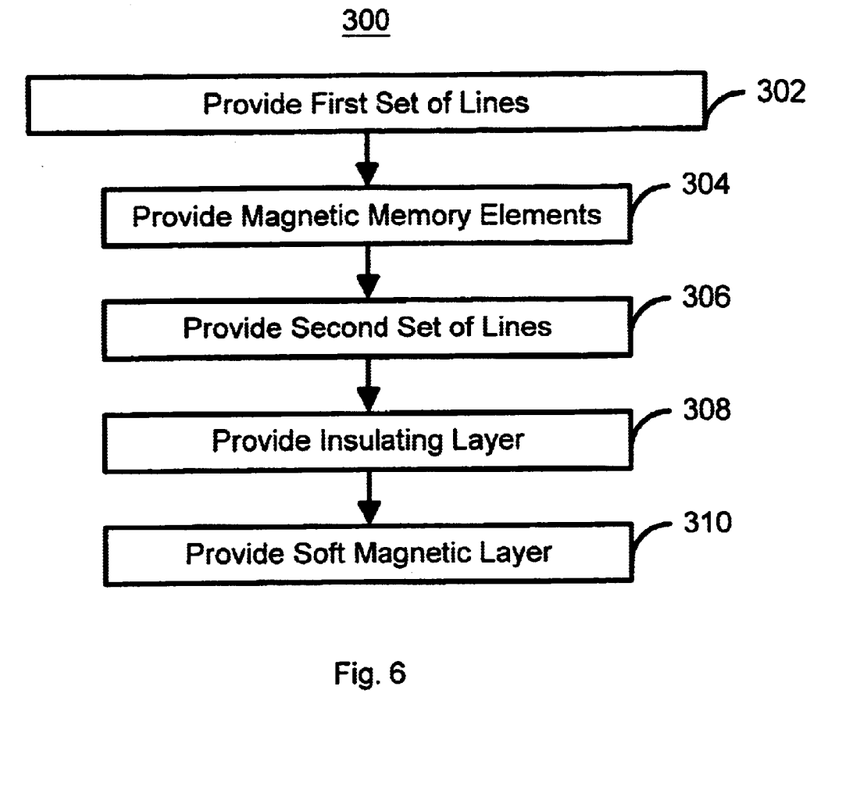
FIG. 6 depicts a high-level flow chart of one embodiment of a method in accordance with the present invention for providing an MRAM device with the present invention.

FIG. 6 depicts a high-level flow chart of one embodiment of a method 300 in accordance with the present invention for providing an MRAM 100 or 200 in accordance with the present invention. For clarity, the method 300 is described in the context of the MRAM 100 and 200. However, the method 300 could be used to fabricate other MRAM in accordance with the present invention. The method 300 commences after the structures lower in the device, such as the selection device 111 and 141 or 208 and 210 have been provided. A first set of write lines is provided, via step 302. In a preferred embodiment, step 302 provides write line 122 above the MTJ stacks 11. However, in an alternate embodiment, step 302 provides the write lines, such as the lines 221 and 222, below the MTJ stacks 11. The magnetic memory elements are provided, via step 304. Step 304 preferably provides the MTJ stacks 11. Step 304 can be performed before or after the step 302, depending on whether the magnetic element is provided above the write lines 221 and 222 or below the write line 122.

A second set of lines, such as the lines 126 and 128 or 225 and 234 is provided, via step 306. The second set of lines is oriented at an angle to the first set of write lines. The magnetic memory elements provided in step 304 reside at intersections of the first and second set of write lines. In one embodiment, step 306 includes providing aluminum lines.

An insulating layer, such as the layer 124 or 226, is provided on the second set of lines, via step 308. The insulating layer surrounding the top and the at least one side of the second set of write lines. Preferably, both sides of the write lines are covered by the insulating layer. To achieve good coverage on all surfaces and maintain a sufficiently small thickness, chemical vapor deposition (CVD) or atomic layer chemical vapor deposition (ALCVD) may be used for step 308. Electric isolation can be achieved even if the insulating film is as thin as 30 nm if ALCVD process is used in step 308. Furthermore, if the second set of lines are aluminum, then step 308 can be simplified. After the lines are fabricated in step 306, preferably using film deposition, photolithography, and etching, an oxidation process can be performed as part of step 308. The oxidation process can change the surface layer of an aluminum line into Al$_2$O$_3$ which is a very good dielectric material. This layer of Al$_2$O$_3$ can be used for the insulating layer 124, except for its lower portion. There are many means of aluminum oxidation, such as exposing aluminum in oxygen atmosphere or in a plasma chamber containing oxygen. The process used for oxidizing the tunneling layer of the MTJ device can be modified for step 308. The thickness of the Al$_2$O$_3$ layer that can be fabricated in step 308 can be very thin and still offers very good uniformity and insulation. For example, the thickness of the tunneling layer of the MTJ device is generally less than three nm, and fairly high resistance can be achieved.

After the insulating film is deposited in step 308, a magnetic layer is provided, via step 310. Step 310 is preferably used to form the soft magnetic layer 130 or 220. The insulating layer resides between the magnetic layer and the second write lines. The magnetic layer includes a soft magnetic material. The soft magnetic layer 130 or 220 preferably has a thickness of two to fifty nm is preferably deposited in step 310 by either physical vapor deposition (PVD) or CVD, completing the write line fabrication process. Because the photolithography and etching process, which are necessary in prior arts for the soft magnetic cladding layer, can be eliminated, wafer process cost is reduced. Additionally, the density and capacity of the memory devices on a chip are not compromised by introducing the soft magnetic cladding layer for the write lines. Thus, using the method 300, the MRAM 100 and/or 200 can be provided relatively simply.

A method and system has been disclosed for an improved magnetic memory. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory cell comprising:
   a magnetic element, the magnetic element being written using a first write line and a second write line, the magnetic element residing at an intersection between the first write line and the second write line, the second write line oriented at an angle to the first write line, at least a portion of the second write line being covered by an insulating layer, a magnetic layer covering at least a portion of the insulating layer, the portion of the insulating layer residing between the magnetic layer and the second write line, the magnetic layer including a soft magnetic material;
   wherein the first write line is a magnetic write line including a core portion, the core portion including a soft magnetic material.

2. A magnetic memory comprising:
   a first plurality of write lines, each of the first plurality of write lines being a magnetic write line including a core portion, the core portion including a soft magnetic material;
   a second plurality of write lines oriented at an angle to the first plurality of write lines, each of the second plurality of write lines having a top and at least one side;
   an insulating layer covering at least a portion of each of the second plurality of write lines; and
   a magnetic layer covering a portion of the insulating layer, the portion of the insulating layer residing between the magnetic layer and the second plurality of write lines, the magnetic layer including a soft magnetic material;
   a plurality of magnetic memory elements residing at intersections of the first plurality of write lines and the second plurality of write lines.

3. The magnetic memory of claim 2 wherein the magnetic write lines is composed of the soft magnetic material.

4. The magnetic memory of claim 2 wherein the first plurality of write lines is electrically connected to the plurality of magnetic memory elements.

5. The magnetic memory of claim 2 wherein the first plurality of write lines reside below the plurality of magnetic memory elements, the first plurality of write lines being electrically isolated from the plurality of magnetic memory elements; and
   wherein the second plurality of write lines reside above the magnetic memory element, the second plurality of write lines being electrically connected to the magnetic memory element.

6. The magnetic memory of claim 2 wherein the insulating layer is formed using a CVD or an ALCVD process.

7. A magnetic memory comprising:
   a first plurality of write lines;
   a second plurality of write lines oriented at an angle to the first plurality of write lines, each of the second plurality of write lines having a top and at least one side;
   an insulating layer covering at least a portion of each of the second plurality of write lines; and
   a magnetic layer covering a portion of the insulating layer, the portion of the insulating layer residing between the magnetic layer and the second plurality of write lines, the magnetic layer including a soft magnetic material;
   a plurality of magnetic memory elements residing at intersections of the first plurality of write lines and the second plurality of write lines;
   wherein the second plurality of write lines include aluminum and wherein the insulating layer is oxidized aluminum.

8. The magnetic memory of claim 2 wherein the insulating layer has a thickness of less than one hundred nanometers.

9. The magnetic memory of claim 2 wherein each of the second plurality of lines has a first thickness and wherein the soft magnetic layer has a second thickness of less than one half the first thickness.

10. A method for providing a magnetic memory comprising the steps of:
    providing a first plurality of write lines, each of the first plurality of write lines being a magnetic write line including a core portion, the core portion including a soft magnetic material;
    providing a plurality of magnetic memory elements;
    providing a second plurality of write lines oriented at an angle to the first plurality of write lines, the plurality of magnetic memory elements residing at intersections of the first plurality of write lines and the second plurality of write lines;
    providing an insulating layer, a portion of the insulating layer covering at least a portion of the second plurality of write lines; and
    providing a magnetic layer, the portion of the insulating layer residing between the magnetic layer and the second plurality of write lines, the magnetic layer including a soft magnetic material.

11. The method of claim 10 wherein the magnetic write lines is composed of the soft magnetic material.

12. The method of claim 10 wherein the first plurality of write lines are electrically connected to the plurality of magnetic memory elements.

13. The method of claim 10 wherein the step of providing the first plurality of write lines includes providing the first plurality of write lines below the plurality of magnetic memory elements, the first write line being electrically isolated from the plurality of magnetic memory elements; and wherein the step of providing the second plurality of write lines includes providing the second plurality of write lines above the plurality of magnetic memory elements, the second write line being electrically connected to the plurality of magnetic memory elements.

14. The method of claim 10 wherein the step of forming the insulating layer includes using a CVD or an ALCVD process.

15. A method for providing a magnetic memory comprising the steps of:

providing a first plurality of write lines;

providing a plurality of magnetic memory elements;

providing a second plurality of write lines oriented at an angle to the first plurality of write lines, the plurality of magnetic memory elements residing at intersections of the first plurality of write lines and the second plurality of write lines;

providing an insulating layer, a portion of the insulating layer covering at least a portion of the second plurality of write lines; and providing a magnetic layer, the portion of the insulating layer residing between the magnetic layer and the second plurality of write lines, the magnetic layer including a soft magnetic material;

wherein the second plurality of write lines include aluminum and wherein the step of providing the insulating layer further includes an aluminum oxidation step.

16. The method of claim 10 wherein the insulating layer has a thickness of less than one hundred nanometers.

17. The method of claim 10 wherein each of the second plurality of lines has a first thickness and wherein the step of providing the magnetic layer includes the step of providing a soft magnetic layer having a second thickness of less than one half the first thickness.

18. The magnetic memory cell of claim 1 wherein the first write line is composed of the soft magnetic material.

19. A magnetic memory cell comprising:

a magnetic element, the magnetic element being written using a first write line and a second write line, the magnetic element residing at an intersection between the first write line and the second write line, the second write line oriented at an angle to the first write line, at least a portion of the second write line being covered by an insulating layer, a magnetic layer covering at least a portion of the insulating layer, the portion of the insulating layer residing between the magnetic layer and the second write line, the magnetic layer including a soft magnetic material;

wherein the second write line includes aluminum and wherein the insulating layer is oxidized aluminum.

\* \* \* \* \*